United States Patent
Yoneyama et al.

(10) Patent No.: US 7,470,996 B2
(45) Date of Patent: Dec. 30, 2008

(54) PACKAGING METHOD

(75) Inventors: Takao Yoneyama, Ogaki (JP);
Kimiharu Kayukawa, Nisshin (JP);
Nobuya Makino, Anjo (JP); Ryuichiro Abe, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 19 days.

(21) Appl. No.: 11/484,700

(22) Filed: Jul. 12, 2006

(65) Prior Publication Data

US 2007/0023483 A1  Feb. 1, 2007

(30) Foreign Application Priority Data

Jul. 27, 2005  (JP) ............................ 2005-216944

(51) Int. Cl.
*H01L 23/48* (2006.01)
*H01L 23/52* (2006.01)
*H01L 29/40* (2006.01)
*H01L 21/00* (2006.01)
*B23K 1/06* (2006.01)
*B23K 5/20* (2006.01)
*B23K 20/10* (2006.01)

(52) U.S. Cl. ................... 257/780; 257/777; 257/778; 257/737; 228/110.1; 438/108

(58) Field of Classification Search ............. 228/110.1; 439/887, 876; 257/737, 778; 438/613, 108
See application file for complete search history.

(56) References Cited

U.S. PATENT DOCUMENTS

| 5,341,979 | A | 8/1994 | Gupta | |
|---|---|---|---|---|
| 6,425,516 | B1 * | 7/2002 | Iwatsu et al. | 228/180.22 |
| 6,426,556 | B1 * | 7/2002 | Lin | 257/738 |
| 6,713,844 | B2 * | 3/2004 | Tatsuta et al. | 257/629 |
| 2002/0151228 | A1 * | 10/2002 | Kweon et al. | 439/887 |

FOREIGN PATENT DOCUMENTS

| JP | A-2000-150573 | 5/2000 |
|---|---|---|
| JP | A-2001-298342 | 10/2001 |
| JP | A-2005-79211 | 3/2005 |
| WO | WO98/58409 | 12/1998 |

OTHER PUBLICATIONS

Tan et al. Thermosonic Flip-chip Bonding Using Longitudinal Ultrasonic Vibration. IEEE Electronic Components and Technology Conference, May 18-21, 1997.*

* cited by examiner

*Primary Examiner*—Jerry Lorengo
*Assistant Examiner*—Noah S Wiese
(74) *Attorney, Agent, or Firm*—Posz Law Group, PLC

(57) ABSTRACT

A packaging method includes ultrasonically bonding a semiconductor device and a substrate together via bumps that include gold as a main component thereof. A contact surface of a primary bump on a surface of an aluminum pad on one side of the substrate contacts and is ultrasonically bonded to a distal end surface of each opposed secondary bump on one side of the semiconductor device. An area of the contact surface is larger than that of the opposed distal end surface. By this method, damage to the substrate from the ultrasonic can be reduced without using a reinforcing layer.

5 Claims, 5 Drawing Sheets

PACKAGING METHOD

CROSS REFERENCE TO RELATED APPLICATION

This application is based on and incorporates herein by reference Japanese Patent Application No. 2005-216944 filed on Jul. 27, 2005.

BACKGROUND OF THE INVENTION

1. Field of the Invention

The present invention relates to a packaging method.

2. Description of Related Art

A packaging structure is disclosed in, for example, JP-11-8270-A (corresponding to WO98/58409). In this structure, a substrate and a semiconductor device are placed in such a manner that one side of the substrate and one side of the semiconductor device are opposed to each other. Furthermore, a primary bump formed on a surface of a pad on the one side of the substrate, and a secondary bump formed on the one side of the semiconductor device, are ultrasonically bonded together. The primary bump and the secondary bump include gold as a main component thereof, and the pad includes aluminum as a main component thereof.

In the course of the ultrasonic bonding, ultrasonic energy is applied to the substrate underneath the pad. Therefore, to prevent damage to the substrate, a conventional packaging method by means of the ultrasonic bonding includes controlling ultrasonic bonding conditions such as amplitude, a load, oscillation time, and temperature.

However, when the substrate is friable, the range of ultrasonic bonding conditions under which the damage is prevented is narrowed down. Hence, a bonding method having the broader range of ultrasonic bonding conditions is demanded.

A certain semiconductor substrate, for example, a silicon IC substrate may be employed for the substrate underneath the pad having aluminum as a main component thereof. Such a substrate includes a friable insulating layer, which is made of a silicon oxide-insulating layer such as a dielectric interlayer. In the above case, particularly, the range of ultrasonic bonding conditions under which the damage is prevented becomes extremely narrow, and thus the substrate is difficult to be put to practical use.

In order to address such difficulty, the inventors of the present application have produced a substrate 10 experimentally shown in FIG. 8. The substrate 10 is an IC substrate that includes a silicon semiconductor substrate. At one side of the substrate 10, an insulating layer 12, which is made of, for example, a silicon dioxide film or the like, is formed. Furthermore, pads 13 are formed on the insulating layer 12.

On a surface of each pad 13, a primary bump 31 that includes gold as a main component thereof is formed respectively, by means of, for example, plating, a wire bonding method, or the like. A reinforcing layer 200 that includes a Ni—Au plating or the like is positioned between the pad 13 and the primary bump 31. Through the intervention of the reinforcing layer 200, a load imposed during the ultrasonic bonding on a material underneath the pad 13 can be mitigated, and accordingly, damage to the material underneath the pad 13, for example, to the insulating layer 12 or the like, can be reduced.

Nevertheless, the intervention of the reinforcing layer 200 entails, for example, a process whereby the reinforcing layer 200 is formed, which may lead to an increase in the number of processes and in production costs.

SUMMARY OF THE INVENTION

The present invention addresses the above disadvantages. Thus, it is an objective of the present invention to provide a packaging method for ultrasonically bonding a semiconductor device and a substrate together via bumps including gold as a main component thereof, whereby damage to the substrate from the ultrasonic is minimized without using the reinforcing layer described above.

To achieve the objective of the present invention, there is provided a packaging method. According to the packaging method, a substrate, which includes a primary bump formed on a surface of a pad, is provided. The pad is formed on a dielectric layer on one side of the substrate. The primary bump includes gold as a main component thereof, and the pad includes aluminum as a main component thereof. Furthermore, a semiconductor device, which includes a secondary bump formed on one side of the semiconductor device, is provided. A size of a distal end contact surface area of the primary bump is larger than a size of a distal end contact surface area of the secondary bump. The substrate and the semiconductor device are positioned in such a manner that the distal end contact surface of the primary bump is opposed to and contacts the distal end contact surface of the secondary bump. The distal end contact surface of the primary bump and the distal end contact surface of the secondary bump are ultrasonically bonded together while the primary bump and the secondary bump are urged against each other and are thereby plastically deformed.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of the present invention will be described with reference to the accompanying drawings. Additionally, the same numerals are used to indicate the same parts in the following description and drawings for the purpose of simplifying the description.

FIRST EMBODIMENT

Figure 1:
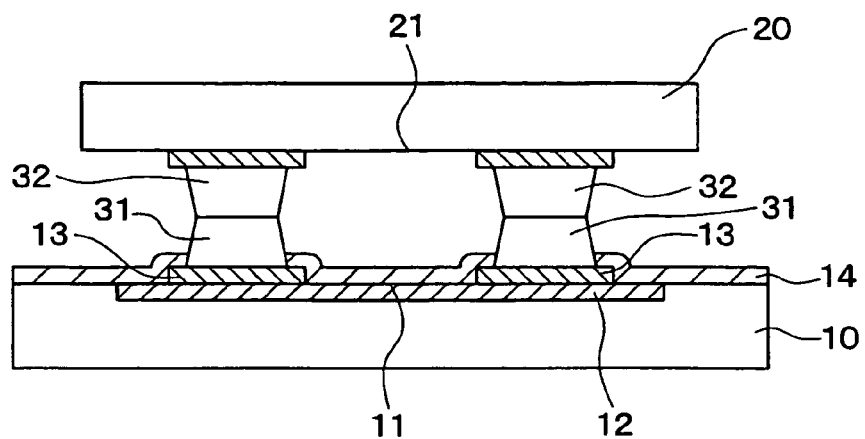
FIG. 1 is a schematic cross-sectional view of a packaging structure of a semiconductor device according to a first embodiment of the present invention.

FIG. 1 is a schematic cross-sectional view of a packaging structure of a semiconductor device according to a first embodiment of the present invention. A substrate 10 is, for example, a commonly used silicon IC substrate, on which transistors and other components are formed through a semiconductor process.

At one side 11 of the substrate 10 (i.e., the upper side of the substrate 10 in FIG. 1), a silicon oxide-insulating layer 12 is formed to serve as a dielectric interlayer. The insulating layer 12 is made as a silicon dioxide film or a film, which includes the silicon oxide and other element(s). For instance, the insulating layer 12 may include boron-doped phospho-silicate glass (BPSG).

Pads 13 that consist primarily of aluminum are formed on the insulating layer 12. Each pad 13 may be made of aluminum alone or made of an aluminum alloy (aluminum content being about 90%). For example, each pad 13 may be made of Al or an Al—Si—Cu alloy. In the case of the Al—Si—Cu alloy, the Al content may be 99% or higher, and Si and Cu constitute the rest of the alloy.

Further, primary bumps 31, which consist primarily of gold, are formed on the surfaces of the pads 13, respectively, of the substrate 10. Each primary bump 31 may include 100% gold or 99% or more gold. Furthermore, the primary bumps 31 are formed by a bump forming process employing a commonly used wire bonding method.

In addition, the region of the one side 11 of the substrate 10 except for that of the pads 13 is coated with a protective film 14 made of silicon nitride, polyimide, or the like.

The semiconductor device 20 may be a typical flip chip or an IC chip. Secondary bumps 32 which consist primarily of gold are formed on one side 21 of the semiconductor device 20 (i.e., the lower side of the semiconductor device 20 in FIG. 1).

Similar to the primary bumps 31, each secondary bump 32 may include 100% gold or 99% or more gold. Furthermore, the secondary bumps 32 are formed by a bump forming process employing the commonly used wire bonding method.

The substrate 10 and the semiconductor device 20 are placed in such a manner that the one side 11 of the substrate 10 and the one side 21 of the semiconductor device 20 are opposed to each other. Furthermore, the primary bumps 31 and the secondary bumps 32 are bonded together by means of ultrasonic bonding to form metal connections therebetween. Thus, the substrate 10 and the semiconductor device 20 are mechanically and electrically connected via the bumps 31, 32.

Figure 2:
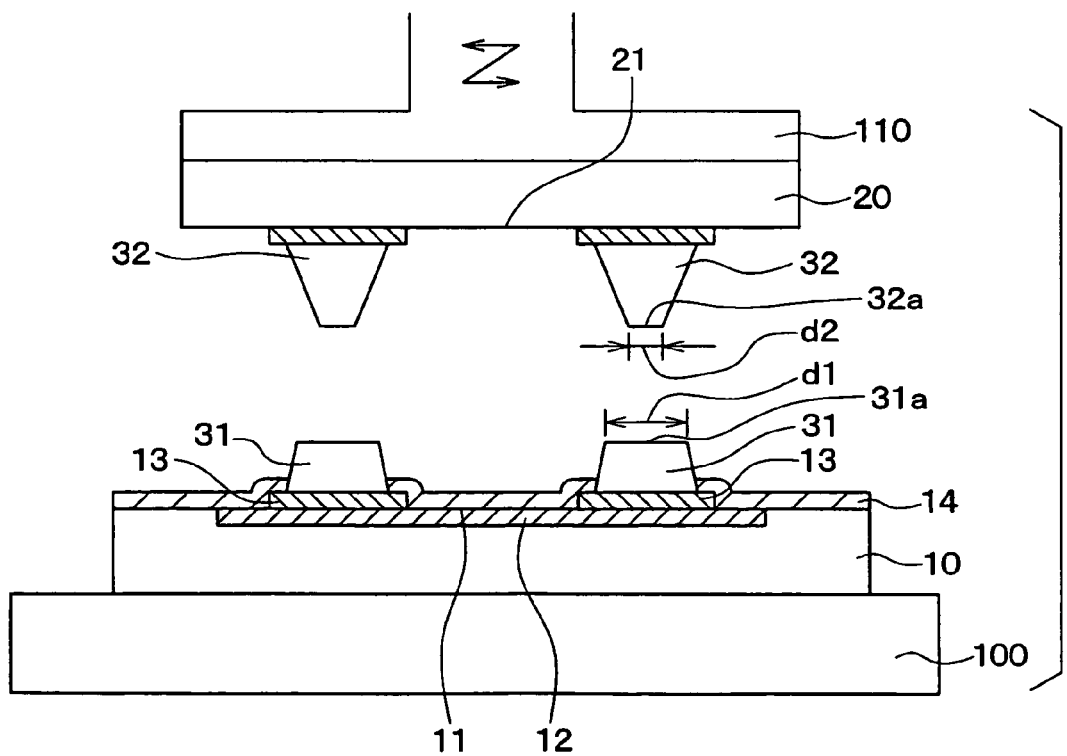
FIG. 2 is a schematic cross-sectional view that depicts a packaging method according to the first embodiment.

With reference to FIG. 2, a packaging method for producing the packaging structure indicated in FIG. 1 will be described. FIG. 2 is a schematic cross-sectional view indicating the packaging method. In FIG. 2, the substrate 10 and the semiconductor device 20 having the bumps 31, 32 respectively are opposed to each other.

In FIG. 2, the substrate 10 is held on a stage 100 of the ultrasonic bonding device by, for example, vacuum suction, and, the semiconductor device 20 is held by a tool 110 through, for example, vacuum suction.

Like similar other known ultrasonic bonding devices, the ultrasonic bonding device of the present embodiment can control the temperature of the stage 100 and the tool 110 to heat the substrate 10 and the semiconductor device 20. Furthermore, the tool 110 can apply the ultrasonic to the semiconductor device 20 while applying a load on the semiconductor device 20, as indicated by the arrows in FIG. 2.

Firstly, by way of photolithographic technique and a spattering method, the pads 13 are formed on the one side of the substrate 10. Each pad 13 may have a thickness of about 0.7 μm (measured in the top-to-bottom direction in FIG. 2).

Next, the primary bumps 31 made of gold are formed on the surface of the pads 13 by means of the commonly used wire bonding method employing gold wire. Then, the free end of each primary bump 31 is planarized through plastic deformation, to form a planar surface 31a. The planar surface 31a forms a contact surface 31a, which contacts a distal end surface 32a of the opposed secondary bump 32 on the semiconductor device 20.

Figure 3:
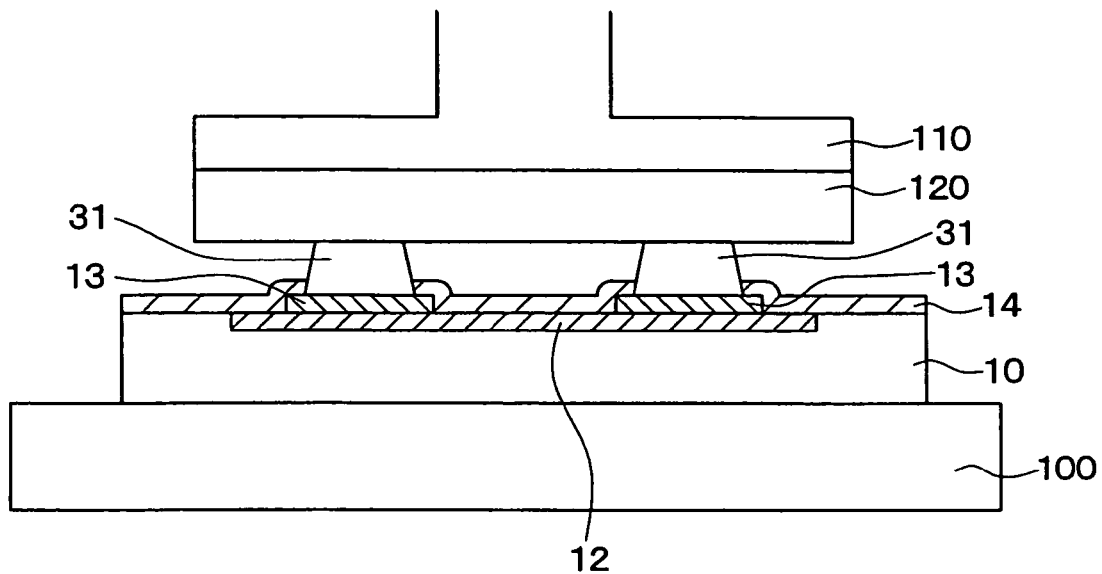
FIG. 3 is a schematic cross-sectional view that depicts an example of processes of forming contact surfaces of primary bumps that are planarized through plastic deformation.

FIG. 3 depicts an exemplary method for forming the contact surface 31a of the primary bump 31 planarized through the plastic deformation.

After the formation of the primary bumps 31 on the surfaces of the pads 13, respectively, the ends of the primary bumps 31 are planarized through the plastic deformation by the tool 110. In a state where the ultrasonic is not applied, the tool 110 imposes loads via a plate 120 of silicon, glass or the like, on the ends of the primary bumps 31. The planarization process using the plastic deformation will be hereinafter referred to as a leveling process.

Furthermore, by means of the commonly used wire bonding method employing gold wire, the secondary bumps 32 made of gold are formed on the one side of the semiconductor device 20. Each secondary bump 32 is opposed to each primary bump 31 of the substrate 10. Like other commonly used bumps, the bumps 31, 32 take generally cylindrical forms that taper towards the ends thereof, and are several tens of micrometers in height.

The contact surface 31a of each primary bump 31 contacts the distal end surface 32a of each opposed secondary bump 32. Each primary bump 31 is formed in such a manner that an area of its contact surface 31a is larger than that of the opposed distal end surface 32a.

The primary bumps 31 having such contact surfaces 31a can be formed by changing a diameter of the wire employed for bump formation. Furthermore, they can also be formed by changing loads applied to the bumps 31 at the time of performing the above leveling process (i.e., pressure of the tool 110 applied on bumps 31).

In the present example, the area of the contact surface 31a of each primary bump 31 is at least 1.4 times larger than that of the distal end surface 32a of each secondary bump 32. More specifically, although the areas are not limited to these values, the diameter d2 (See FIG. 2) of the surface 32a may be 60 μm, and the diameter d1 (See FIG. 2) of the surface 31a may be 70 μm or more.

The bumps 31, 32 are formed on the substrate 10 and on the semiconductor device 20 respectively in this manner. As shown in FIG. 2, the substrate 10 and the semiconductor device 20 are secured to the stage 100 and to the tool 110 respectively. As a result, the one side 11 of the substrate 10 is opposed to the one side 21 of the semiconductor device 20.

The semiconductor device 20 is brought close to the substrate 10 by the tool 110 to mount the semiconductor device 20 on the substrate 10. While the semiconductor device 20 is being mounted on the substrate 10, the contact surface 31a of each primary bump 31 and the distal end surface 32a of each opposed secondary bump 32 are kept in contact.

The bumps 31, 32 are ultrasonically bonded together by the tool 110 applying the ultrasonic to the semiconductor device 20. Meanwhile, the substrate 10 and the semiconductor device 20 are heated by the stage 100 and the tool 110 respectively. Consequently, as compared to those shown in FIG. 2, the ends of the bumps 31, 32 are somewhat crushed to form metal connections, which results in the packaging structure as shown in FIG. 1.

In the present embodiment, the area of the contact surface 31a of each primary bump 31 is larger than that of the distal end surface 32a of each secondary bump 32. The justification for this arrangement will be given below.

In one test case, the secondary bumps 32 are formed on the semiconductor device 20, and the diameter d2 of the distal end surface 32a of each secondary bump 32 is adjusted to 60 μm. Then, four different substrates 10 (i.e., a first substrate to a fourth substrate) are produced. Through the leveling process, the diameter d1 of the contact surface 31a of the primary bump 31 on the first substrate 10 is adjusted to 60 μm (d2, PROCESSED in FIG. 4). The diameter d1 of the contact surface 31a of the primary bump 31 on the second substrate 10 is adjusted to 70 μm (d2+10, PROCESSED in FIG. 4). The diameter d1 of the contact surface 31a of the primary bump 31 on the third substrate 10 is adjusted to 80 μm (d2+20, PROCESSED in FIG. 4). Lastly, the diameter d1 of the contact surface 31a of the primary bump 31 on the fourth substrate 10 is adjusted to 90 μm (d2+30, PROCESSED in FIG. 4). Additionally, another substrate 10 is produced. The diameter d1 of the contact surface 31a of the primary bump 31 on this substrate 10 is adjusted to 60 μm without the leveling process (d2, UNPROCESSED in FIG. 4).

Then, the ultrasonic bonding is carried out for each sample. The ultrasonic bonding conditions are, amplitude: 2.8 μm, oscillation time: 0.3 seconds, a peak load: 4N/4 bumps, and temperature of the tool and the stage: 150° C.

After the ultrasonic bonding, each package is immersed in hydrochloric acid (approximately 35%, at the room temperature), so that the pads 13 on the substrate 10 are etched to expose the insulating layer 12 underneath to allow visual observation through a microscope. For each pad 13 of all sample packages, the insulating layer 12 is examined for damage from the ultrasonic bonding.

Cases where cracks and distortion of the insulating layer 12 are observed through the optical microscope are defined as damage occurrences. The distortion of the insulating layer 12 is represented by an interference pattern that is observed through the optical microscope. A ratio of the number of damaged pads 13 to the total number of the examined pads 13 is defined as a rate of damage occurrence (%). The results of the damage examination are plotted on FIG. 4.

Figure 4:
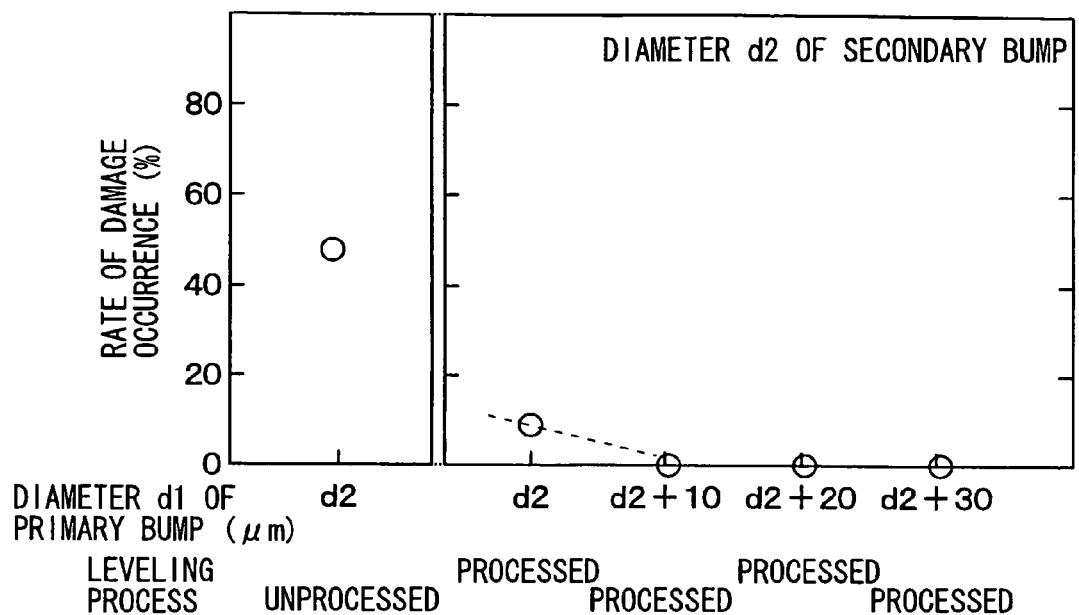
FIG. 4 is a diagram that indicates a relationship between a diameter of the primary bumps and a rate of damage occurrence.

FIG. 4 shows the relationship between the diameter d1 of one of the primary bumps 31 and the rate of damage occurrence. As indicated in FIG. 4, the rate of damage occurrence is reduced as the diameter d1 becomes larger than the diameter d2 of the distal end surfaces 32a of the opposed secondary bump 32. That is, as the area of the surface 31a becomes larger than that of the surface 32a, the rate of damage occurrence reduces.

Reduced stress on underneath the pad 13 may account for the above tendency. That is to say, by making the area of the surface 31a of the primary bump 31 larger than that of the surface 32a, the load that is imposed by the opposed secondary bump 32 during the bonding is dispersed over the contact surface 31a. Thus, in order to achieve the effect of reducing the rate of damage occurrence, the area of the contact surface 31a of the primary bump 31 should be larger than that of the distal end surface 32a of the opposed secondary bump 32.

Furthermore, according to FIG. 4, the rate of damage occurrence is approximately 0 when the diameter d1 of the contact surface 31a of the primary bump 31 is more than 10 μm larger than the diameter d2 of the distal end surface 32a of the opposed secondary bump 32. This corresponds to the area of the surface 31a being more than approximately 1.4 times larger than that of the surface 32a.

Therefore, the area of the contact surface 31a of the primary bump 31 should be (preferably at least 1.4 times) larger than that of the distal end surface 32a of the opposed secondary bump 32. When the contact and the ultrasonic bonding between the bumps 31, 32 are performed under this condition, the damage to the substrate 10 from the ultrasonic can be reduced without the above reinforcing layer.

Therefore, the present embodiment leads to a wider range of ultrasonic bonding conditions that the damage be prevented than the previously proposed art.

Moreover, as indicated in FIG. 4, the rate of damage occurrence for the case of the leveling processed sample is significantly reduced, as compared to the rate for the case of the sample without the leveling process. Since the contact surface 31a of the primary bump 31 is planarized through the plastic deformation, the primary bump 31 may have been even less subject to the deformation while being ultrasonically bonded to the opposed secondary bump 32.

The primary bump 31 is deformed as a result of the load imposed thereon during the ultrasonic bonding. Furthermore, the deformation of the primary bump 31 may cause partial stress concentration on the substrate 10, which may render the damage to the substrate 10 more likely. Through the leveling process, a possibility of occurrence of the stress concentration can be reduced.

By making the area of the contact surface 31a of the primary bump 31 larger than that of the distal end surface 32a of the opposed secondary bump 32, a contour of the surface 31a becomes larger than that of the surface 32a. For this reason, adjustment of relative positions of the bumps 31, 32 is facilitated to restrain their misalignment.

Figure 5:
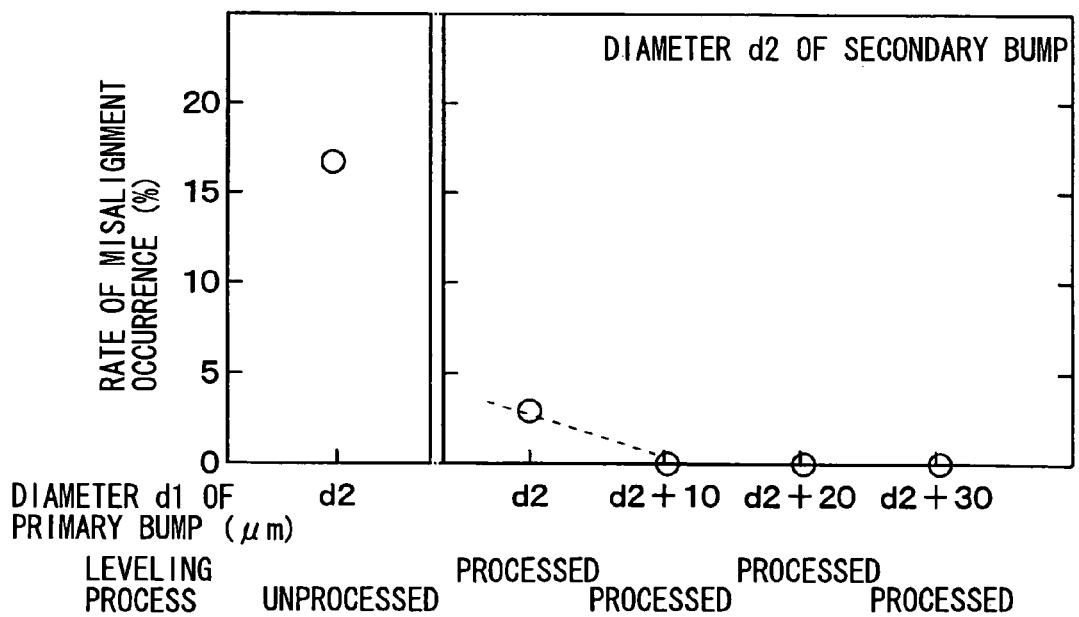
FIG. 5 is a diagram that specifically indicates an effect of restraining misalignment of the bumps in the first embodiment.

With reference to FIG. 5, a tangible effect of restraining the misalignment will be described. The misalignment of the bumps 31, 32 is observed X-ray fluoroscopically. The same samples and ultrasonic bonding conditions as employed in FIG. 4 are applied to the observation.

When the amount of protrusion of one of the bumps from the other is 40 μm or more, such protrusion is defined as misalignment occurrence. As indicated in FIG. 5, the misalignment of the bumps 31, 32 can be restrained by means of the present embodiment.

SECOND EMBODIMENT

Figure 6A:
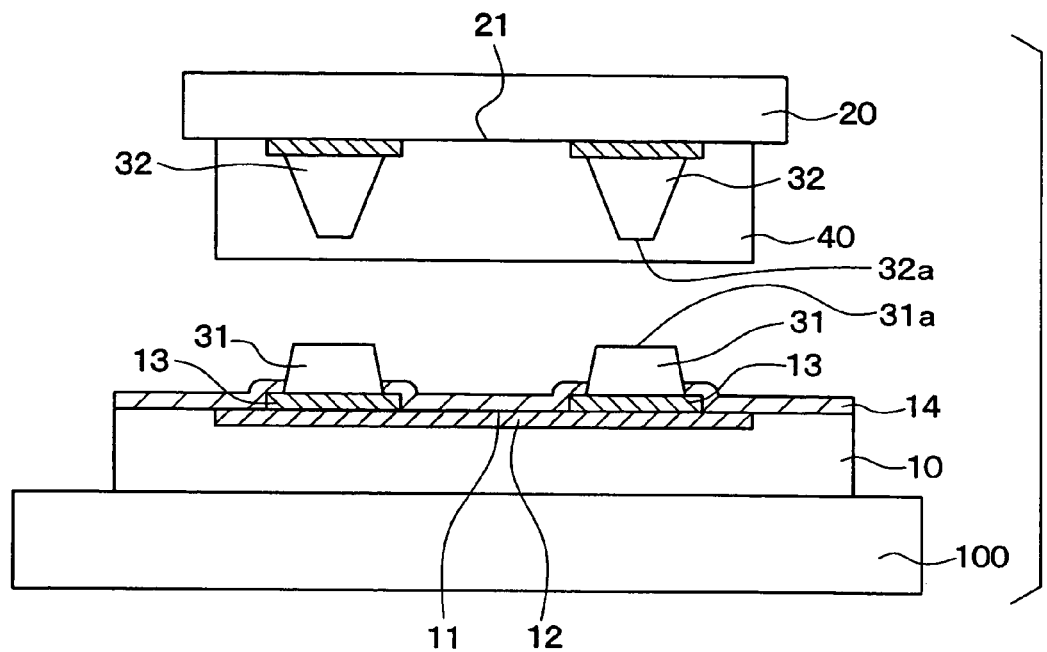
FIGS. 6A and 6B are schematic cross-sectional views that depict a method for packaging a semiconductor device according to a second embodiment of the present invention.
Figure 6B:
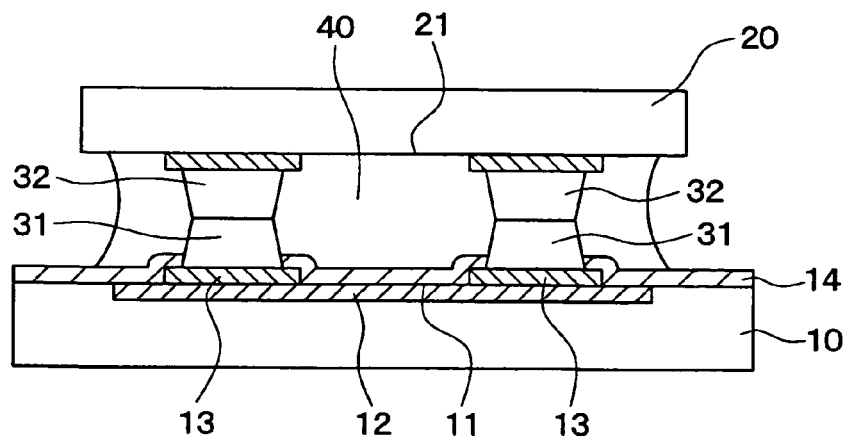

FIGS. 6A and 6B are schematic cross-sectional views that depict a method for packaging a semiconductor device according to the second embodiment of the present invention. In the present embodiment, the ultrasonic bonding is performed with a resin member 40 added to the first embodiment. In FIG. 6A, the tool 110 is omitted. The stage 100 and the tool 110 are also omitted in FIG. 6B.

Like in the first embodiment, primary bumps 31 are formed on one side of the substrate 10, whereas secondary bumps 32 are formed on one side of the semiconductor device 20 by the packaging method in the present embodiment. Similarly, the area of a contact surface 31a of each primary bump 31 is larger than that of a distal end surface 32a of the opposed secondary bump 32, which is also employed in the first embodiment.

Secondly, the semiconductor device 20 is mounted on the substrate 10 with each primary bump 31 and the opposed secondary bump 32 in contact, via a resin member (a resin material) 40. The resin member 40 is made of nonconductive resin, and intervenes between the above bumps, as shown in FIG. 6A.

NCF (Non Conductive Film) serving as a nonconductive resin layer, which softens during the ultrasonic bonding, is employed as the resin member 40. The member 40 is adhered to the one side 21 of the semiconductor device 20, so that the secondary bumps 32 are covered in the member 40.

Then, the resin member 40 is heated to be softened via the substrate 10 and the semiconductor device 20 by means of the stage 100 and the tool 110. Simultaneously, using the tool 110, the semiconductor device 20 is pressed on the substrate 10. As a result, the bumps 31, 32 are brought into direct contact, pushing away the softened member 40 from the location between the bumps.

In the above state, similar to the first embodiment, the ultrasonic is applied to the semiconductor device 20 with the substrate 10 and the semiconductor device 20 heated. In consequence, the bumps 31, 32 are ultrasonically bonded together, and the packaging structure of the present embodiment is produced as shown in FIG. 6B. In this structure, metal connection is formed between the bumps 31, 32 through the intervention of the resin member 40.

Next, the justification for the ultrasonic bonding of the bumps 31, 32 through the intervention of the resin member 40 therebetween will be provided below.

In one test case, the secondary bumps 32 are formed on the one side of the semiconductor device 20. The diameter d2 of each distal end surface 32a is adjusted to 60 µm. The primary bumps 31 are formed on the one side of the substrate 10. Through the leveling process, the diameter d1 of each contact surface 31a is adjusted to 80 µm.

Following this, the ultrasonic bonding is implemented for each sample, with and without the intervention of the resin member 40. The ultrasonic bonding conditions are, the amplitude: 2.5-3.5 µm, the oscillation time: 0.2-0.5 seconds, the peak load: 6N/4 bumps, the temperature of the stage: 150° C., and the temperature of the tool: 130° C.

After the bonding, each sample package is immersed in fuming nitric acid (approximately 70-90° C.), so that the resin member 40 is dissolved and removed. Then, each sample is immersed in hydrochloric acid (approximately 35%, at the room temperature). Consequently, the pads 13 on the substrate 10 are etched to expose the insulating layer 12 underneath to allow visual observation through the microscope.

For each pad 13 of all sample packages, the insulating layer 12 is examined for the damage from the ultrasonic bonding. Similar to the first embodiment, the rate of damage occurrence (%) is employed for a measure of the damage. The results of the damage investigation are plotted on FIG. 7.

Figure 7:
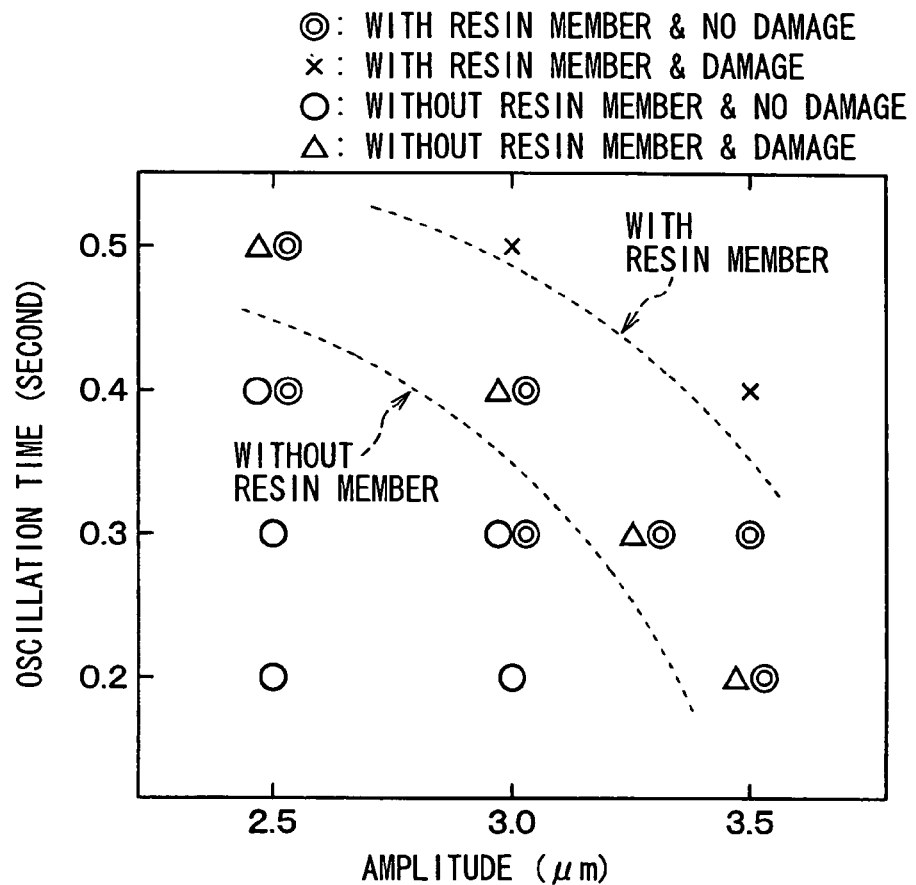
FIG. 7 is a diagram that indicates the damage occurrence under various ultrasonic bonding conditions with and without intervention of a resin member.
Figure 8:
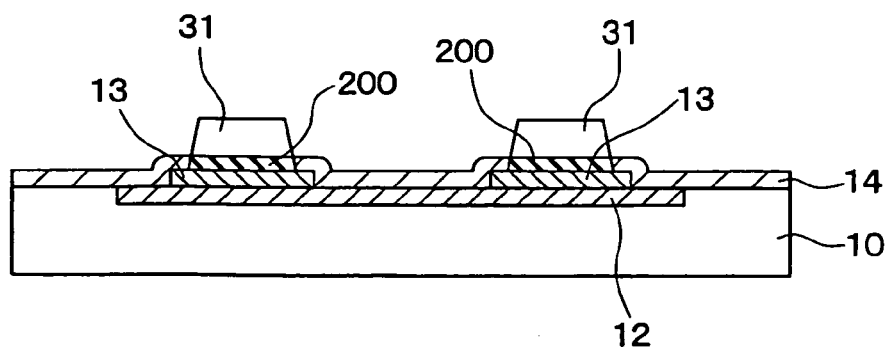
FIG. 8 is a schematic cross-sectional view of a previously proposed substrate as a prototype made by the inventors of the present application.

FIG. 7 shows the damage occurrence under varied ultrasonic bonding conditions with and without the intervention of the resin member 40. Severeness of the ultrasonic bonding conditions is controlled by the amplitude (µm) and the oscillation time (second). As the amplitude grows larger and the oscillation time longer, the conditions become severer, rendering the rate of damage occurrence larger.

As shown in FIG. 7, the damage occurrence to the substrate 10 is prevented under severer bonding conditions with, than without, the intervention of the resin member 40. Two dashed lines in FIG. 7 indicate approximate upper limits of the bonding conditions, under which the damage to the substrate 10 does not occur. The two dashed lines "without the resin member" and "with the resin member" indicate the approximate upper limits when the member 40 does not, and does intervene between the bumps, respectively.

Thus, the intervention of the resin member 40 enables the prevention of the damage to the substrate 10 under severer ultrasonic bonding conditions. Accordingly, the extent of feasible conditions can be expanded in a severer direction when the member 40 intervenes, as indicated with the above dashed line "with the resin member" in FIG. 7.

Therefore, in the present embodiment, the damage to the substrate 10 can be even more effectively controlled by employing the packaging method through the intervention of the resin member 40. The member 40 may mitigate ultrasonic oscillation energy applied to the substrate 10 via the bumps 31, 32.

OTHER EMBODIMENTS

As described above, the bumps 31, 32 are ultrasonically bonded together to form metal connections by the tool 110 applying the ultrasonic thereto. If possible, application of the ultrasonic can be stopped or reduced on completion of the bonding of the bumps 31, 32.

For instance, through monitoring a load (force) imposed on the tool 110 that holds the semiconductor device 20, the ultrasonic oscillation is stopped or reduced at the moment when the load changes. In conventional ultrasonic bonding devices, since the oscillation time is controlled by setting it beforehand, the ultrasonic oscillation cannot be stopped even after the completion of the bonding, which has contributed to damage occurrences. Hence, by stopping or reducing the ultrasonic oscillation as soon as the bonding is completed, additional ultrasonic oscillation energy can be prevented from being applied to the substrate 10, and the damage occurrences can be averted.

In the second embodiment, although film-like substances such as NCF are employed for the resin member 40, the member 40 can be one of those formed through application of paste.

In the above embodiments, while the leveling process is performed by means of the tool 110 of the ultrasonic bonding device, the leveling process can alternatively be carried out with some device that can impose loads.

With respect to the formation of the bumps 31, 32, instead of the wire bonding method, plating by use of masks, for example, can be employed.

In the above embodiments, the substrate 10 includes the silicon oxide-insulating layer 12 underneath the pads 13. The present packaging method can be applied to substrates not having such insulating layers.

Additional advantages and modifications will readily occur to those skilled in the art. The invention in its broader terms is therefore not limited to the specific details, representative apparatus, and illustrative examples shown and described.

What is claimed is:
1. A packaging method comprising:
providing a substrate that includes a primary bump formed on a surface of a pad, which is in turn formed on a dielectric layer on one side of the substrate, wherein
the dielectric layer, the pad and the primary bump are placed adjacent to one another in this order along an imaginary line that is generally perpendicular to the plane of the substrate;
the primary bump includes gold as a main component of the primary bump, and
the pad includes aluminum as a main component of the pad;

providing a semiconductor device that includes a secondary bump formed on one side of the semiconductor device, wherein
  a size of a distal end contact surface area of the primary bump is larger than a size of a distal end contact surface area of the secondary bump;
positioning the substrate and the semiconductor device in such a manner that the distal end contact surface of the primary bump is opposed to and contacts the distal end contact surface of the secondary bump; and
ultrasonically bonding the distal end contact surface of the primary bump and the distal end contact surface of the secondary bump together while the primary bump and the secondary bump are urged against each other and are thereby plastically deformed.

2. The packaging method according to claim 1, further comprising
  flattening die distal end contact surface area of the primary bump by plastically deforming the distal end contact surface area of the primary bump before the positioning of the substrate and the semiconductor device.

3. The packaging method according to claim 1, wherein the providing of the substrate includes forming the distal end contact surface area of the primary bump in such a manner that the size of the distal end contact surface area of the primary bump is at least 1.4 times greater than the size of the distal end contact surface area of the secondary bump.

4. The packaging method according to claim 1, further comprising
  providing a resin material between the primary bump and the secondary bump before the ultrasonically bonding, wherein
  the ultrasonic bonding includes urging the semiconductor device against the substrate upon softening of the resin material, so that the distal end contact surface area of the primary bump and the distal end contact surface area of the secondary bump directly contact each other and are ultrasonically bonded together.

5. The packaging method according to claim 1, wherein:
the providing of the semiconductor device includes forming the secondary bump from a material, which is the same as that of the primary bump; and
the packaging method further comprises:
  pressing a planar pressing surface of a presser against a distal end of the primary bump in a pressing direction, which is generally perpendicular to the plane of the substrate, to compress the primary bump before the positioning of the substrate and the semiconductor device, so that a degree of plasticity of the primary bump is reduced in comparison to a degree of plasticity of the secondary bump, and the distal end contact surface of the primary bump is flattened in a plane that is generally perpendicular to the pressing direction.

* * * * *